(12) United States Patent
Barrett et al.

(10) Patent No.: US 11,021,779 B2
(45) Date of Patent: Jun. 1, 2021

(54) SACRIFICIAL 3-DIMENSIONAL WEAVING METHOD AND CERAMIC MATRIX COMPOSITES FORMED THEREFROM

(71) Applicants: Rolls-Royce High Temperature Composites Inc., Cypress, CA (US); Rolls-Royce Corporation, Indianapolis, IN (US)

(72) Inventors: Chris Barrett, Huntington Beach, CA (US); Steffan Brown, Long Beach, CA (US)

(73) Assignees: ROLLS-ROYCE HIGH TEMPERATURE COMPOSITES INC., Cypress, CA (US); ROLLS-ROYCE CORPORATION, Indianapolis, IN (US)

( * ) Notice: Subject to any disclaimer, the term of this patent is extended or adjusted under 35 U.S.C. 154(b) by 491 days.

(21) Appl. No.: 15/963,212

(22) Filed: Apr. 26, 2018

(65) Prior Publication Data
US 2018/0312950 A1 Nov. 1, 2018

Related U.S. Application Data

(60) Provisional application No. 62/492,462, filed on May 1, 2017.

(51) Int. Cl.
*C22C 47/08* (2006.01)
*C22C 47/06* (2006.01)
(Continued)

(52) U.S. Cl.
CPC ............ *C22C 47/062* (2013.01); *B22F 5/009* (2013.01); *B22F 5/04* (2013.01); *B32B 1/00* (2013.01);
(Continued)

(58) Field of Classification Search
USPC ............................................. 264/258; 164/98
See application file for complete search history.

(56) References Cited

U.S. PATENT DOCUMENTS 7,153,464 B2 * 12/2006 Millard ................. C04B 38/065
264/317
8,057,880 B2 * 11/2011 Petervary ................ B32B 38/04
428/139
(Continued)

OTHER PUBLICATIONS

McClain, Mike et al., "Rapid Assembly of Fiber Preforms Using 3D Woven Components," Technical Paper, Albany Engineered Composites, Inc., Presented at *Society for the Advancement of Material and Process Engineering 2012 (SAMPE 2012)*, Baltimore, MD; 10 pages.
(Continued)

*Primary Examiner* — Tom P Duong
(74) *Attorney, Agent, or Firm* — Brinks Gilson & Lione

(57) ABSTRACT

A ceramic matrix composite (CMC) is formed using a three-dimensional (3-D) woven preform by removing the set of sacrificial fibers from the 3-D woven preform and allowing a metal or metal alloy infiltrate the 3-D woven preform. The 3-D woven preform is formed by a method that includes providing a woven layer comprising a first set of ceramic fibers oriented in a first (x) direction woven with a second set of ceramic fibers oriented in a second (y) direction; stacking a plurality of woven layers on top of each other, said woven layers providing a two-dimensional (2-D) preform; weaving a set of sacrificial fibers in a third (z) direction with the 2-D preform, said weaving providing the 3-D woven preform; and shaping the 3-D woven preform into a predetermined shape.

18 Claims, 4 Drawing Sheets

(51) Int. Cl.

| | | |
|---|---|---|
| *B32B 5/26* | (2006.01) | |
| *D03D 11/00* | (2006.01) | |
| *B32B 1/00* | (2006.01) | |
| *B32B 5/02* | (2006.01) | |
| *C04B 35/622* | (2006.01) | |
| *C23C 16/04* | (2006.01) | |
| *D03D 25/00* | (2006.01) | |
| *C04B 35/80* | (2006.01) | |
| *B22F 5/04* | (2006.01) | |
| *B22F 5/00* | (2006.01) | |
| *C04B 41/51* | (2006.01) | |
| *D03D 15/68* | (2021.01) | |

(52) U.S. Cl.
CPC ............... *B32B 5/024* (2013.01); *B32B 5/26* (2013.01); *C04B 35/62227* (2013.01); *C04B 35/80* (2013.01); *C22C 47/066* (2013.01); *C22C 47/08* (2013.01); *C23C 16/045* (2013.01); *D03D 11/00* (2013.01); *D03D 25/005* (2013.01); *B32B 2250/20* (2013.01); *B32B 2262/105* (2013.01); *B32B 2605/18* (2013.01); *C04B 41/51* (2013.01); *C04B 2235/524* (2013.01); *C04B 2235/5212* (2013.01); *C04B 2235/5224* (2013.01); *C04B 2235/5228* (2013.01); *C04B 2235/5236* (2013.01); *C04B 2235/5244* (2013.01); *C04B 2235/5248* (2013.01); *C04B 2235/5252* (2013.01); *C04B 2235/5256* (2013.01); *C04B 2235/5264* (2013.01); *C04B 2235/5268* (2013.01); *D03D 15/68* (2021.01); *D10B 2101/08* (2013.01); *D10B 2321/06* (2013.01); *D10B 2331/02* (2013.01); *D10B 2331/04* (2013.01); *D10B 2505/02* (2013.01); *D10B 2505/12* (2013.01)

(56) References Cited

U.S. PATENT DOCUMENTS

| | | | |
|---|---|---|---|
| 8,153,539 | B2 | 4/2012 | Coupe et al. |
| 8,263,504 | B2 | 9/2012 | Bouillon et al. |
| 9,708,226 | B2* | 7/2017 | Lazur ................ C04B 35/62894 |
| 9,951,221 | B2 | 4/2018 | Esser-Kahn et al. |
| 10,024,175 | B2 | 7/2018 | Varney |
| 2006/0163773 | A1* | 7/2006 | Gray ................ C04B 35/62884 |
| | | | 264/270 |
| 2006/0284337 | A1* | 12/2006 | Subramanian ........ C04B 35/806 |
| | | | 264/258 |
| 2010/0279845 | A1* | 11/2010 | Kebbede ........... C04B 35/62873 |
| | | | 501/90 |
| 2011/0293828 | A1* | 12/2011 | Eberling-Fux .......... C04B 35/83 |
| | | | 427/249.2 |
| 2012/0076927 | A1* | 3/2012 | Bhatt .................... C04B 35/565 |
| | | | 427/122 |
| 2016/0115086 | A1* | 4/2016 | Tuertscher .............. C04B 41/85 |
| | | | 264/29.1 |
| 2016/0230570 | A1* | 8/2016 | Harris ............... C04B 35/62894 |
| 2016/0312626 | A1* | 10/2016 | Schetzel ................. F01D 5/282 |
| 2016/0326064 | A1* | 11/2016 | Shim ..................... C04B 35/806 |
| 2017/0044069 | A1* | 2/2017 | Harris ............... C04B 35/62849 |
| 2019/0040760 | A1 | 2/2019 | Clegg |

OTHER PUBLICATIONS

Unal, Pelin Gurkan, "3D Woven Fabrics," in *Woven Fabrics*, Han-Yong Jeon (Ed.), InTech, DOI: 10.5772/37492 (2012), pp. 91-120.

* cited by examiner

SACRIFICIAL 3-DIMENSIONAL WEAVING METHOD AND CERAMIC MATRIX COMPOSITES FORMED THEREFROM

CROSS-REFERENCE TO RELATED APPLICATIONS

This application claims priority to U.S. Provisional Application No. 62/492,462 filed May 1, 2017, the entire content of which is incorporated herein by reference.

TECHNICAL FIELD

This disclosure relates generally to the design and manufacture of a ceramic matrix composite (CMC). More specifically, this disclosure relates to the three-dimensional (3-D) weaving of ceramic and sacrificial fibers into a ceramic preform that is used to form a ceramic matrix composite.

BACKGROUND

The statements in this section merely provide background information related to the present disclosure and may not constitute prior art.

Ceramic matrix composites (CMC) may be made using a 2-dimensional preform or lay-up part in which a majority of the ceramic fibers are oriented and woven together in only the x and y directions. The use of such a 2-dimensional lay-up part to make a ceramic matrix composite may be time consuming.

Another approach to making a CMC is to weave the ceramic fibers in all directions (x, y, and z directions). A woven block of ceramic fibers may be more easily formed into the shape of a particular structure or component. However, in this case, not all of the ceramic fibers in the CMC are oriented within the x-y plane. Instead, some of the ceramic fibers are orientated in the inter-laminar (Z) direction. Thus although 3-D weaving of the ceramic fibers used to reinforce a CMC may enhance inter-laminar properties, it also has the tendency to reduce the in-plane (X & Y) properties exhibited by the CMC.

BRIEF DESCRIPTION OF THE DRAWINGS

In order that the disclosure may be well understood, there will now be described various forms thereof, given by way of example, reference being made to the accompanying drawings, in which.

Figure 1:
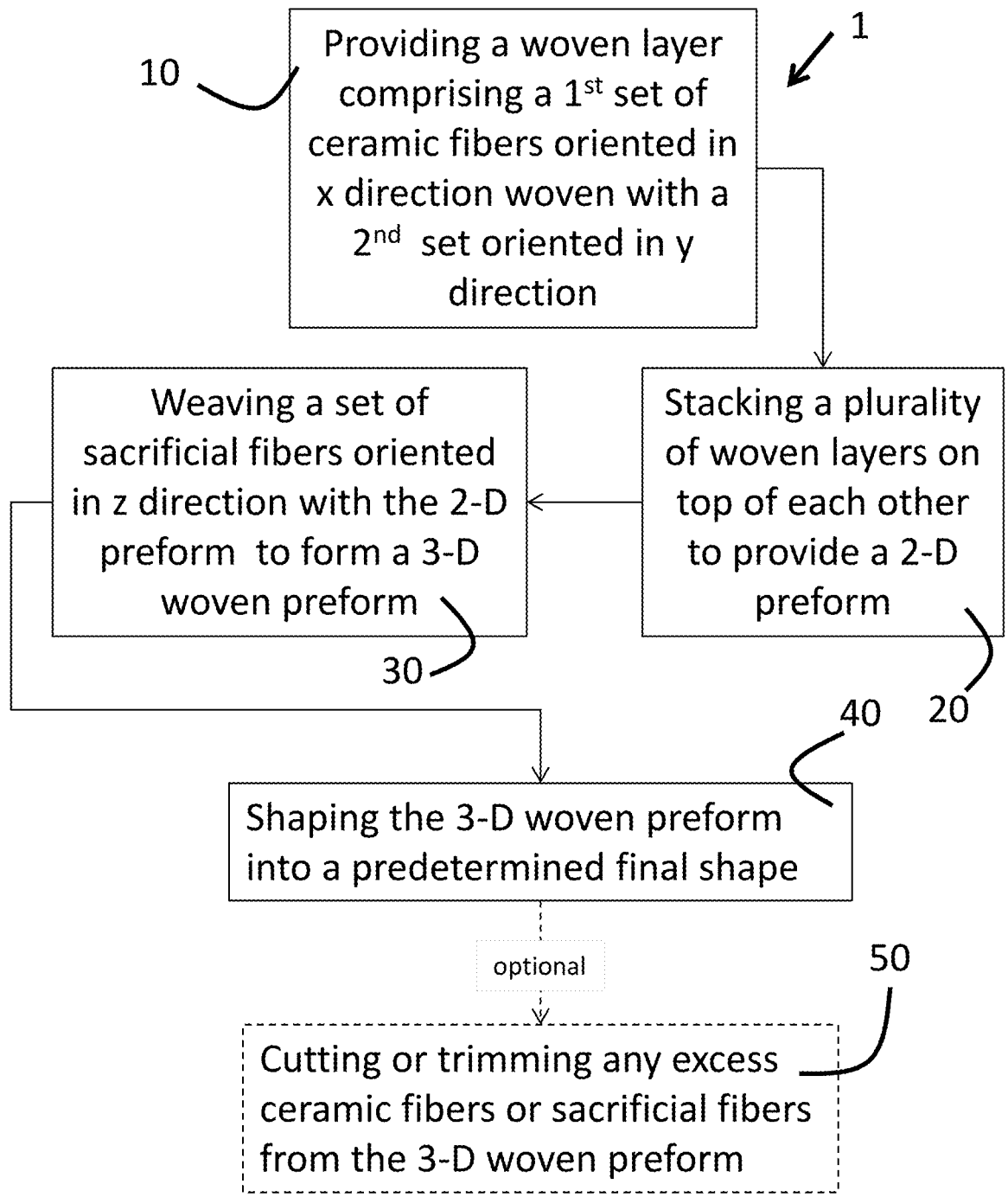
FIG. 1 is a flow diagram of a method of forming a woven preform using 3-dimensional weaving of ceramic fibers and sacrificial fibers according to the teachings of the present disclosure.

The drawings described herein are for illustration purposes only and are not intended to limit the scope of the present disclosure in any way.

DETAILED DESCRIPTION

The following description is merely exemplary in nature and is in no way intended to limit the present disclosure or its application or uses. For example, the ceramic matrix composites (CMCs) made and used according to the teachings contained herein is described throughout the present disclosure in conjunction with seal segments in order to more fully illustrate the composition and the use thereof. The incorporation and use of such CMCs in other applications, including without limitation, vanes, blades, airfoils, or the like are contemplated to be within the scope of the present disclosure. It should be understood that throughout the description, corresponding reference numerals indicate like or corresponding parts and features.

The present disclosure generally provides a method of forming a ceramic matrix composite (CMC) using a three-dimensional (3-D) woven preform. Referring to FIG. 1, the 3-D woven preform is formed according to a method 1 that comprises weaving a first set of ceramic fibers oriented in a first (x) direction with a second set of ceramic fibers oriented in a second (y) direction 10 to form a woven layer. A plurality of woven layers is stacked on top of each other 20, thereby, providing a two-dimensional (2-D) preform. A set of sacrificial fibers is woven in a third (z) direction with the 2-D preform 30 in order to form the 3-D woven preform. The 3-D woven preform is then shaped into a predetermined shape 40. When desired or necessary, any excess ceramic fibers or sacrificial fibers may be cut or trimmed 50 from the 3-D woven preform. The predetermined shape for the 3-D woven preform is selected based on the final geometry desired for the ceramic matrix composite (CMC).

Figure 2:
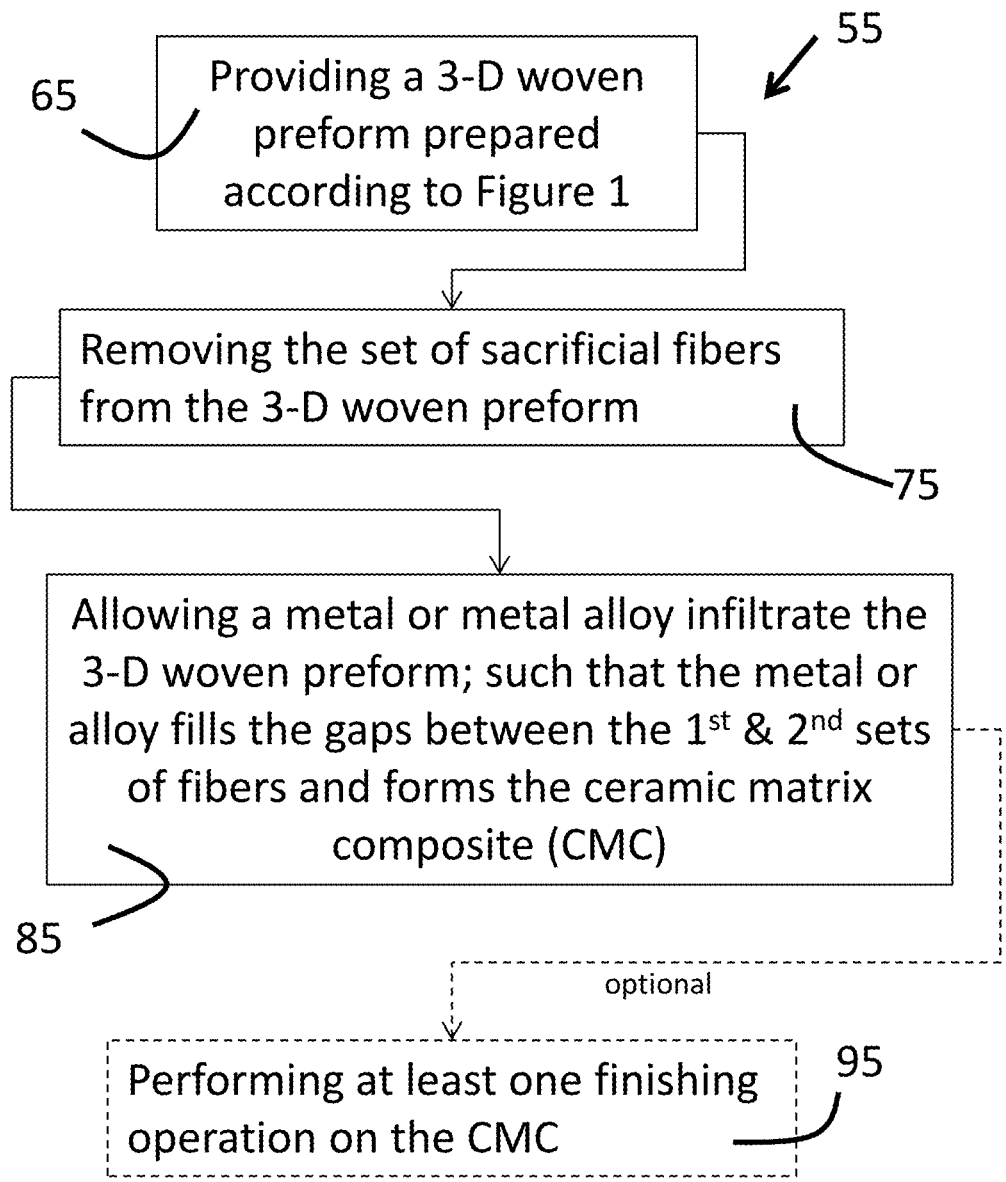
FIG. 2 is a flow diagram of a method of forming a ceramic matrix composite (CMC) using the 3-D woven preform of FIG. 1.

Referring now to FIG. 2, a method 55 of forming a ceramic matrix composite (CMC) body from the 3-D woven preform may be accomplished by providing the 3-D woven preform prepared according to the process described above in FIG. 1 and as further defined herein 65; removing the set of sacrificial fibers from the 3-D woven preform 75; and allowing a metal or metal alloy infiltrate the 3-D woven preform 85. The metal or metal alloy may fill any gaps or free volume that may be located between the first and second sets of ceramic fibers. When desirable or necessary, the method 55 may further comprise performing at least one finishing operation 95 on the ceramic matrix composite (CMC). The finishing operations may include, but not be limited to, grinding, sanding, cutting, trimming, densification, brazing, or surface treatment, to name a few.

The sacrificial fibers may be removed from the ceramic matrix composite body prior to infiltration of the metal or metal alloy, using any suitable mechanism, including without limitation, oxidation, chemical etching, leaching, or mechanical removal. For example, the sacrificial fibers may be removed by burning out the sacrificial fibers by exposing the 3-D woven preform to an elevated temperature up to about 1,000° C. with or without the use of a partial or full vacuum. When a vacuum is utilized no hold time upon reaching the elevated temperature of about 1,000° C. may be necessary. Alternatively, the sacrificial fibers are removed by allowing the sacrificial fibers to leach or dissolve in a fluid medium, such as water, an organic solvent, or a mixture thereof, in which the sacrificial fibers are soluble.

The infiltration of the metal or metal alloy into the 3-D woven preform 85 may include any method known in the art including, but not limited to a melt infiltration process, a chemical vapor infiltration process, or a combination thereof. Alternatively, a chemical vapor infiltration coating may be applied to the 3-D woven preform prior to the melt infiltration in order to stiffen the ceramic fibers. The metal or metal alloy that is allowed to infiltrate the 3-D woven matrix may comprise, without limitation, aluminum, silicon, nickel, titanium, or mixtures and alloys thereof. Alternatively, the metal or metal alloy consists of or consists essentially of aluminum, silicon, nickel, titanium, and mixtures or alloys thereof.

According to one aspect of the present disclosure, the method of forming a 3-D woven preform uses an additional sacrificial fiber to weave in a third (z) direction, while keeping all other fibers in the same orientation (x and y directions) as they would be in a 2-D preform or lay-up part. Thus a ceramic matrix composite (CMC) formed according to the teachings of the present disclosure provides the benefits associated with the "best of both worlds"—one that may benefit from the preforming advantages of 3-D weaving, while maintaining the material properties of a 2-D lay-up part. In other words, the material properties of the CMC may remain the same as those obtained when using a 2-D preform, while also benefiting from reduced preform variation and reduced preforming operation time associated with a 3-D woven preform.

The use of 3-D weaving according to the teachings of the present disclosure allows a full component or sub-component to be supplied as woven preform. A 3-D woven preform reduces the requirement for individual ply cutting and also reduces the preforming operation time compared to a 2-D preform method. The use of 3-D weaving enables better control of the fibers oriented in the x and y directions, thereby, ensuring the formation of a more consistent preform as compared to a conventional 2-D layup where the layers may shift relative to each other. Utilizing 3-D weaving also enables optimization of fiber architecture and integral deltoids which are not possible with a 2-D layup. This allows difficult deltoids, curvature, or change in directions to be integrated into the preform while still maintaining the 2-D properties throughout the bulk of the part.

By 3-D weaving a sacrificial fiber in the woven preform (z direction), a design engineer may replicate the fiber alignment of a 2-D lay-up by using the sacrificial fiber as a temporary binding fiber to hold the 2-D woven layers (x & y directions) in the correct orientation until the preform is processed. Upon the CMC part being fully processed, the sacrificial fiber is removed resulting in a final fiber architecture that is equivalent to the fiber architecture in a 2-D lay-up part.

Figure 3:
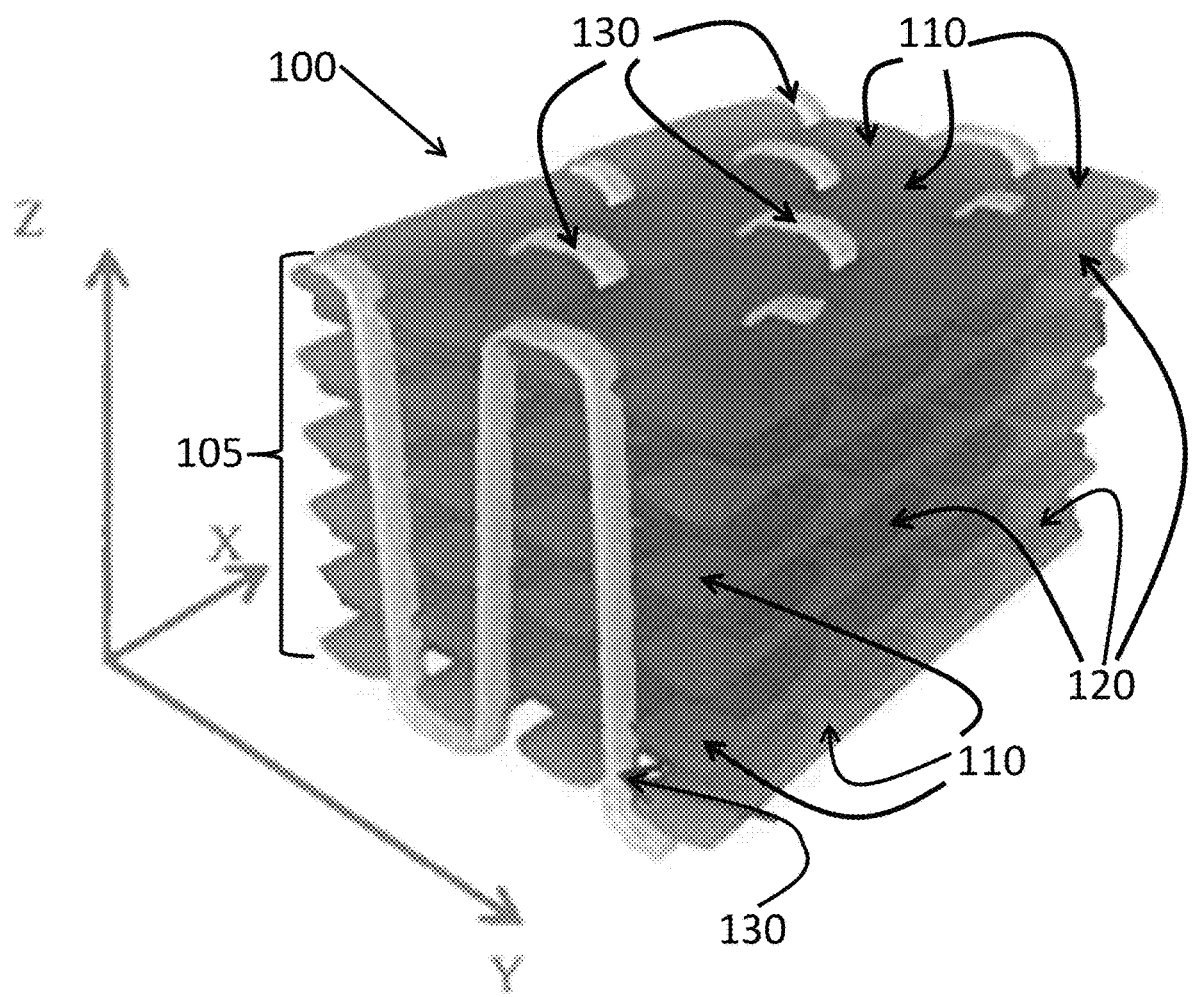
FIG. 3 a schematic representation of a ceramic preform formed according to the method of FIG. 1 highlighting the orientation of the ceramic and sacrificial fibers therein.

Referring now to FIG. 3, the 3-D woven preform 100 comprises a 2-dimensional (2-D) preform 105 and a set of sacrificial fibers 130. The 2-D preform 105 comprises ceramic fiber layers 105 stacked on top of each other. Each of the fiber layers comprise a first set of ceramic fibers oriented in a first (x) direction 110 woven with a second set of ceramic fibers oriented in a second (y) direction 120. The 2-D preform includes gaps or free space located between the woven ceramic fibers. Thus the 2-D preform is considered to be porous by nature. The first and second sets of ceramic fibers are woven such that each are present in an amount that ranges between about 5 to about 25 pick per inch (PPI); alternatively, about 10 to about 20 PPI; alternatively, about 12 to about 18 PPI.

The sacrificial fibers may be woven such that each of the sacrificial fibers goes through the entire stack of ceramic fiber layers. Alternatively, each of the sacrificial fiber layers may be woven such that they do not go through the entire stack of ceramic fiber layers. Rather, some of the sacrificial fibers may be woven through only a portion of the ceramic fiber layers. The sacrificial fibers occupy a portion of the volume in the 2-D preform that is considered free space. The sacrificial fibers are woven into the 2-D preform, such they are present in an amount that ranges between about 5 to about 25 pick per inch (PPI); alternatively, about 10 to about 20 PPI; alternatively, about 12 to about 18 PPI.

The overall amount of the sacrificial fibers present in the 3-D woven preform may be similar to or the same as the amount of ceramic fibers oriented in the x direction and in the y direction. When desirable, the overall amount of sacrificial fibers present in the 3-D woven preform is less than or more than the amount of ceramic fibers in the x and y directions. Alternatively, the ratio of the number of sacrificial fibers to the number of ceramic fibers in the x or y direction is between about 0.7:1 and about 1.3:1; alternatively, between about 0.8:1 and about 1.2:1; alternatively, between about 0.9:1 and about 1.1:1; alternatively, about 1:1.

The 3-D woven preform may be fixed or shaped into a predetermined shape. This predetermined shape may represent the shape of the final ceramic matrix composite (CMC). The picks per inch of the sacrificial fibers in the 3-D woven preform may increase in a region of the predetermined shape that represents a deltoid, sharp curve, or a change in direction. The 3-D woven may be shaped by any means known in the art, including, but not limited to the use of heat, pressure, or a combination thereof.

Referring again to FIG. 3, the ceramic fibers 110, 120, as well as the sacrificial fibers 130 may include individual fiber filaments or a bundle and/or a tow of filaments. The filaments in each bundle or tow may be braided or otherwise arranged. The fibers in the first and second sets of ceramic fibers may be of the same or different composition and/or diameter. Alternatively, the fibers in the first and second set of ceramic fibers are the same in at least one of said composition and/or diameter.

The fibers in the first set and second set of ceramic fibers may comprise a material that is stable at temperatures above 1,000° C. Each of the ceramic fibers may be individually selected to comprise, consist of, or consist essentially of, a composition that includes, without limitation, alumina, mullite, silicon carbide, silicon nitride, zirconia, carbon, or a combination thereof. Alternatively, the ceramic fibers are silicon carbide, silicon nitride, or a combination thereof. The ceramic fiber filaments may have a diameter that is between about 1 micrometer (μm) to about 50 μm; alternatively, about 5 μm to about 30 μm; alternatively, about 10 μm to about 20 μm.

The sacrificial fibers 130 may comprise a material made from organic polymers, copolymers, or a mixture thereof. Several examples of sacrificial fibers 130 include, without limitation, a composition comprising, consisting of, or consisting essentially of polyvinyl alcohols (PVA), polyamides, polyesters, or a combination thereof. Specific examples of a polyamide include nylon and KEVLAR® (a registered trademark of du Pont de Nemours and Company of Delaware). A specific example of a polyvinyl alcohol (PVA) includes ELVANOL® (a registered trademark of du Pont de Nemours and Company of Delaware). The sacrificial fiber filaments may have a diameter that is similar to sizes described above for the ceramic fiber filaments. When desirable, the sacrificial fibers may be chemically tailored not to change shape during initial heating, nor to leave any substantial amount of char or residue after being removed at an elevated temperature.

Figure 4:
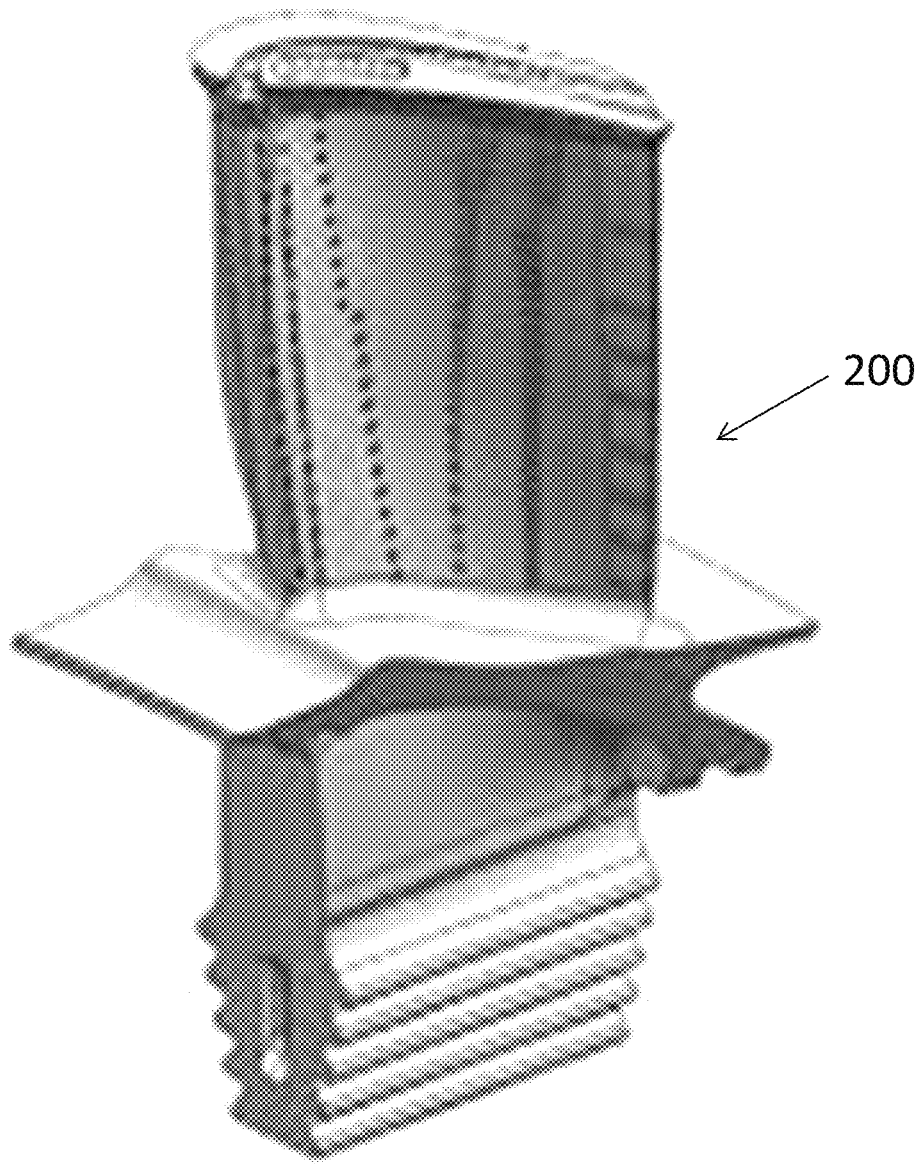
FIG. 4 is a schematic representation of an example of a ceramic matrix composite (CMC) formed according to the method of FIG. 2 that uses the 3-D woven preform of FIG. 3 as formed according to the method of FIG. 1.

The ceramic matrix composite (CMC) formed using the 3-D woven preform of the present disclosure may be shaped into a component for use in a variety of applications, including without limitation, applications in the aerospace and/or automotive industries. Referring now to FIG. 4, several specific examples of components 200 used in the aerospace industry may include seal segments, airfoils, turbine blades, and vanes. If the CMC component 200 is an airfoil, the CMC component 200 may be subject to high temperatures, therefor requiring stability at temperatures that exceed 1,000° C.

For the purpose of this disclosure the terms "about" and "substantially" are used herein with respect to measurable values and ranges due to expected variations known to those skilled in the art (e.g., limitations and variability in measurements).

As used herein, the term "polymer" refers to a molecule having polymerized units of one or more species of monomer. The term "polymer" is understood to include both homopolymers and copolymers. The term "copolymer" refers to a polymer having polymerized units of two or more species of monomers, and is understood to include terpolymers. As used herein, reference to "a" polymer or other chemical compound refers one or more molecules of the polymer or chemical compound, rather than being limited to a single molecule of the polymer or chemical compound. Furthermore, the one or more molecules may or may not be identical, so long as they fall under the category of the chemical compound.

The recitations of numerical ranges by endpoints include the endpoints and all numbers within that numerical range. For example, a concentration ranging from 40% by weight to 60% by weight includes concentrations of 40% by weight, 60% by weight, and all concentrations there between (e.g., 40.1%, 41%, 45%, 50%, 52.5%, 55%, 59%, etc.).

The terms "at least one" and "one or more of" an element are used interchangeably and may have the same meaning. These terms, which refer to the inclusion of a single element or a plurality of the elements, may also be represented by the suffix "(s)" at the end of the element. For example, "at least one fiber", "one or more fibers", and "fiber(s)" may be used interchangeably and are intended to have the same meaning.

To clarify the use of and to hereby provide notice to the public, the phrases "at least one of <A>, <B>, ... and <N>" or "at least one of <A>, <B>, <N>, or combinations thereof" or "<A>, <B>, ... and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

Within this specification, embodiments have been described in a way which enables a clear and concise specification to be written, but it is intended and will be appreciated that embodiments may be variously combined or separated without parting from the invention. For example, it will be appreciated that all preferred features described herein are applicable to all aspects of the invention described herein.

The subject-matter of the disclosure may also relate, among others, to the following aspects:

1. A method of forming a three-dimensional (3-D) woven preform for use in a ceramic matrix composite (CMC), the method comprising:

providing a woven layer comprising a first set of ceramic fibers oriented in a first (x) direction woven with a second set of ceramic fibers oriented in a second (y) direction;

stacking a plurality of woven layers on top of each other, said woven layers providing a two-dimensional (2-D) preform;

weaving a set of sacrificial fibers in a third (z) direction with the 2-D preform, said weaving providing the 3-D woven preform; and shaping the 3-D woven preform into a predetermined shape.

2. The method according to aspect 1, wherein the first set of ceramic fibers and the second set of ceramic fibers comprise individual filaments or filament bundles that are the same or different in composition and/or diameter.

3. The method according to aspect 2, wherein the first set of ceramic fibers and the second set of ceramic fibers are the same in composition and/or diameter.

4. The method according to any of aspects 1-3, wherein the first set of ceramic fibers, the second set of ceramic fibers, and the sacrificial fibers are woven such that each are present in an amount that ranges between about 10 to about 20 picks per inch.

5. The method according to aspect 4, wherein the picks per inch of the sacrificial fibers in the 3-D woven preform increases in a region of the predetermined shape that represents a deltoid, sharp curve, or a change in direction.

6. The method according to any of aspects 1-5, wherein the method further comprises cutting or trimming any excess ceramic fibers or sacrificial fibers from the 3-D woven preform.

7. A 3-D woven preform comprising:

a 2-dimensional (2-D) preform that includes a plurality of woven layers stacked on top of each other, each woven layer comprising:

a first set of ceramic fibers having a length that is oriented in a first (x) direction; and a second set of ceramic fibers having a length that is oriented in a second (y) direction, wherein the first set and second set of ceramic fibers are woven together; and a set of sacrificial fibers having a length that is oriented in a third (z) direction, wherein the sacrificial fibers are woven together with the 2-D preform.

8. The 3-D woven preform according to aspect 7, wherein a portion of the 2-D preform includes free volume space, such that the sacrificial fibers in the 3-D woven preform occupy a portion of the free volume space.

9. The 3-D woven preform according to any of aspects 7 or 8, where the first set and second set of ceramic fibers are stable at a temperature that is at or above 1,000° C.

10. The 3-D woven preform according to any of aspects 7-9, wherein the first set and second set of ceramic fibers are individually selected from the group of alumina, mullite, silicon carbide, silicon nitride, zirconia, carbon, or combinations thereof.

11. The 3-D woven preform according to any of aspects 7-10, wherein the sacrificial fibers comprise individual fibers or fiber bundles made from organic polymers, co-polymers, or a mixture thereof.

12. The 3-D woven preform according to any of aspects 7-11, wherein the sacrificial fibers have a composition selected as one from the group of consisting of a polyvinyl alcohol (PVA), a polyamide, a polyester, and a combination thereof.

13. A method of forming a ceramic matrix composite (CMC), the method comprising:
providing a 3-D woven preform that is formed according to the weaving method of any of aspects 1-6;
removing the set of sacrificial fibers from the 3-D woven preform; and
infiltrating the 3-D woven preform with a metal or metal alloy to form the ceramic matrix composite (CMC);
wherein the metal or metal alloy fills any gaps or free volume that is located between the first and second sets of ceramic fibers.

14. The method according to aspect 13, wherein the metal or metal alloy infiltrates the 3-D woven preform by a melt infiltration process, a chemical vapor infiltration process, or a combination thereof.

15. The method according to any of aspects 13 or 14, wherein the sacrificial fibers are removed by oxidation, chemical etching, leaching, or mechanical removal.

16. The method according to aspect 15, wherein the oxidation occurs by heating the 3-D woven preform up to a temperature of 1,000° C.

17. The method according to any of aspects 13-16, wherein the method further comprises performing at least one finishing operation on the CMC.

18. A component that comprises a ceramic matrix composite (CMC) formed according to the method of any of aspects 13-17.

19. The component according to aspects 18, wherein the component is a seal segment, an airfoil, a turbine blade, or a vane.

20. The use of a component according to any of aspects 18 or 19 in an aerospace or automotive application.

The foregoing description of various forms of the invention has been presented for purposes of illustration and description. It is not intended to be exhaustive or to limit the invention to the precise forms disclosed. Numerous modifications or variations are possible in light of the above teachings. The forms discussed were chosen and described to provide the best illustration of the principles of the invention and its practical application to thereby enable one of ordinary skill in the art to utilize the invention in various forms and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of forming a ceramic matrix composite (CMC), the method comprising:
providing a woven layer comprising a first set of ceramic fibers oriented in a first (x) direction woven with a second set of ceramic fibers oriented in a second (y) direction:
stacking a plurality of woven layers on top of each other, said woven layers providing a two-dimensional (2-D) preform;
weaving a set of sacrificial fibers in a third (z) direction with the 2-D preform, said weaving providing the 3-D woven preform; and
shaping the 3-D woven preform into a predetermined shape;
removing the set of sacrificial fibers from the 3-D woven preform; and
infiltrating the 3-D woven preform with a metal or metal alloy to form the ceramic matrix composite (CMC);
wherein the metal or metal alloy fills any gaps or free volume that is located between the first and second sets of ceramic fibers.

2. The method according to claim 1, wherein the metal or metal alloy infiltrates the 3-D woven preform by a melt infiltration process, a chemical vapor infiltration process, or a combination thereof.

3. The method according to claim 1, wherein the sacrificial fibers are removed by oxidation, chemical etching, leaching, or mechanical removal.

4. The method according to claim 1, wherein the removal comprises exposing the 3-D woven preform up to an elevated temperature up to about 1,000° C.

5. The method according to claim 1, wherein the method further comprises performing at least one finishing operation on the CMC.

6. A component that comprises a ceramic matrix composite (CMC) formed according to the method of claim 1.

7. The component according to claim 6, wherein the component is a seal segment, an airfoil, a turbine blade, or a vane.

8. The component according to claim 6 used in an aerospace or automotive application.

9. The method according to claim 1, wherein the first set of ceramic fibers, the second set of ceramic fibers, and the sacrificial fibers are woven such that each are present in an amount that ranges between about 10 to about 20 picks per inch.

10. The method according to claim 9, wherein the picks per inch of the sacrificial fibers in the 3-D woven preform increases in a region of the predetermined shape that represents a deltoid, sharp curve, or a change in direction.

11. The method according to claim 1, wherein an overall amount of the sacrificial fibers present in the 3-D woven preform is less than an amount of the ceramic fibers in the x and y directions.

12. The method according to claim 1, wherein a ratio of a number of sacrificial fibers to a number of ceramic fibers in the x or y direction is between about 0.7:1 and about 1.3:1.

13. The method according to claim 1, wherein the method further comprises cutting or trimming any excess ceramic fibers or sacrificial fibers from the 3-D woven preform.

14. The method according to claim 1, where the first set and second set of ceramic fibers are stable at a temperature that is at or above 1,000° C.

15. The method according to claim 1, wherein the first set and second set of ceramic fibers are individually selected from the group of alumina, mullite, silicon carbide, silicon nitride, zirconia, carbon, or combinations thereof.

16. The method according to claim 1, wherein the sacrificial fibers comprise individual fibers or fiber bundles made from organic polymers, co-polymers, or a mixture thereof.

17. The method according to claim 1, wherein the sacrificial fibers have a composition selected as one from the group of consisting of: a polyvinyl alcohol (PVA), a polyamide, a polyester, and a combination thereof.

18. The method according to claim 1, wherein a component selected from the group consisting of: a seal segment, an airfoil, a turbine blade, and a vane comprises the CMC.

* * * * *